(12) United States Patent
Dhote et al.

(10) Patent No.: US 9,646,909 B2
(45) Date of Patent: May 9, 2017

(54) ELECTRICAL SWITCH AND MOUNTING ASSEMBLY THEREFOR

(71) Applicant: EATON CORPORATION, Cleveland, OH (US)

(72) Inventors: Navneet Ramkrushnaji Dhote, Maharashtra (IN); Nitin Rawal, Maharashtra (IN); Oscar L. Neundorfer, Senoia, GA (US); Pramod Kumar, Peachtree City, GA (US); Pravin Pralhad Kulkarni, Pune (IN)

(73) Assignee: EATON CORPORATION, Cleveland, OH (US)

( * ) Notice: Subject to any disclaimer, the term of this patent is extended or adjusted under 35 U.S.C. 154(b) by 52 days.

(21) Appl. No.: 14/585,398

(22) Filed: Dec. 30, 2014

(65) Prior Publication Data

US 2016/0190025 A1 Jun. 30, 2016

(51) Int. Cl.
| | |
|---|---|
| H01L 23/16 | (2006.01) |
| H01L 23/08 | (2006.01) |
| H01L 23/32 | (2006.01) |
| H01L 23/367 | (2006.01) |
| H01L 23/053 | (2006.01) |
| H01L 29/772 | (2006.01) |
| H01L 23/40 | (2006.01) |
| H05B 33/08 | (2006.01) |

(52) U.S. Cl.
CPC ......... *H01L 23/32* (2013.01); *H01L 23/4006* (2013.01); *H01L 23/4093* (2013.01); *H05B 33/0815* (2013.01); *H01L 2924/0002* (2013.01)

(58) Field of Classification Search
None
See application file for complete search history.

(56) References Cited

U.S. PATENT DOCUMENTS

| 6,587,344 B1 * | 7/2003 | Ross | H01L 21/4882 165/185 |
|---|---|---|---|
| 7,663,885 B2 * | 2/2010 | Ogawa | H01L 23/4006 165/80.3 |
| 7,715,196 B2 * | 5/2010 | Chen | H05K 7/2049 165/185 |
| 2009/0014863 A1 * | 1/2009 | Chiang | H01L 23/367 257/706 |
| 2013/0010428 A1 * | 1/2013 | Hayashi | H01L 23/4093 361/704 |

* cited by examiner

*Primary Examiner* — Robert Carpenter
(74) *Attorney, Agent, or Firm* — Erkert Seamans; John Powers; Grant Coffield

(57) ABSTRACT

A mounting assembly is for an electrical switch, such as for example, a dimmer switch, which includes a heat sink. The mounting assembly includes a switching member, an insulator disposed between the switching member and the heat sink, and a separate cover member overlaying the switching member. The separate cover member is structured to secure the switching member and the insulator to the heat sink. The switching member includes a switch body and a conductive tab. The separate cover member secures the switching member to the heat sink, without requiring a separate fastener to be inserted through a hole in the conductive tab. The insulator electrically isolates the conductive tab from the heat sink.

20 Claims, 5 Drawing Sheets

ELECTRICAL SWITCH AND MOUNTING ASSEMBLY THEREFOR

CROSS-REFERENCE TO RELATED APPLICATION

This application is related to commonly assigned, concurrently filed U.S. patent application Ser. No. 14/585,395, filed Dec. 30, 2014, and entitled "ELECTRICAL SWITCH AND SLIDER ASSEMBLY THEREFOR" which is incorporated herein by reference.

BACKGROUND

Field

The disclosed concept relates generally to electrical switches and, more particularly, to electrical switches such as, for example, dimmer switches. The disclosed concept also relates to mounting assemblies for dimmer switches.

Background Information

Electrical switches, such as dimmer switches, are commonly used to control the amount of power delivered to an electrical load, for example, in order to control the intensity of a lighting load, or to control the speed of a ceiling fan.

A dimmer switch is typically mounted to an electrical box disposed in a wall, and is electrically connected between a power source and the electrical load. The dimmer switch generally includes a faceplate coupled to the electrical box, and a user interface, such as a rotating knob, linear slider, or rocker switch, which is movably disposed on the faceplate. The dimmer switch may also include a button or toggle for switching the load ON and OFF. The user interface cooperates with a semiconductor switch, such as field effect transistor (FET), to control the current delivered to the load. That is, the rotating knob or linear slider user interface is movable (i.e., adjustable) to correspondingly to adjust (i.e., control) the current delivered to the load and thus the intensity of the light or the speed of the fan.

A conventional FET mounting assembly 2 is shown in FIG. 1. As shown, the mounting assembly 2 includes a FET 4 mounted to a grounded metal strap 6 (e.g., heat sink). Specifically, the FET 4 includes a metal tab 8 having a thru hole 10. An insulator 12, which also has a thru hole 14, is disposed between the metal tab 8 and heat sink 6 to electrically isolate the components. A screw 16 extends through an insulating bushing 18, which itself extends through hole 10 of metal tab 8, hole 14 of insulator 12, as well as a corresponding thru hole 20 in the metal strap 6, in order to fasten the FET 4 to the heat sink 6. In the example, shown, a washer 22 is disposed between the head of the screw 16 and the shoulder of the insulating bushing 18. Among other disadvantages, such FET mounting schemes are not as robust as desired and are prone to suffer from problematic issues, such as dielectric breakdown.

There is, therefore, room for improvement in dimmer switches and in mounting assemblies therefor.

SUMMARY

These needs and others are met by embodiments of the disclosed concept, which are directed to a mounting assembly for an electrical switch, which among other benefits is robust and exhibits improved thermal conductivity and electrical isolation and dielectric performance.

As one aspect of the disclosed concept, a mounting assembly is provided for an electrical switch. The electrical switch includes a heat sink. The mounting assembly comprises: a switching member; an insulator structured to be disposed between the switching member and the heat sink; and a separate cover member overlaying the switching member and being structured to secure the switching member and the insulator to the heat sink.

The switching member may comprise a switch body, a conductive tab, a first side, and a second side disposed opposite the first side. The conductive tab may extend laterally outwardly from the switch body, and the insulator may be structured to be disposed between the first side and the heat sink. The separate cover member may cooperate with the second side. The conductive tab may include a thru hole, wherein the separate cover member is structured to secure the switching member to the heat sink, without requiring a separate fastener to be inserted through the thru hole. The insulator may be a planar member devoid of any holes or apertures, thereby electrically isolating the conductive tab from the heat sink.

The separate cover member may be a molded member comprising a number of protrusions and a number of projections. The protrusions may be structured to removably couple the separate cover member to the heat sink. The projections may be structured to bias the switching member against the insulator and the heat sink. The separate cover member may be a single-piece molded member, and may be made from a liquid crystalline polymer.

As another aspect of the disclosed concept, an electrical switch comprises: a heat sink; and a mounting assembly comprising: a switching member, an insulator disposed between the switching member and the heat sink, and a separate cover member overlaying the switching member and securing the switching member and the insulator to the heat sink.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
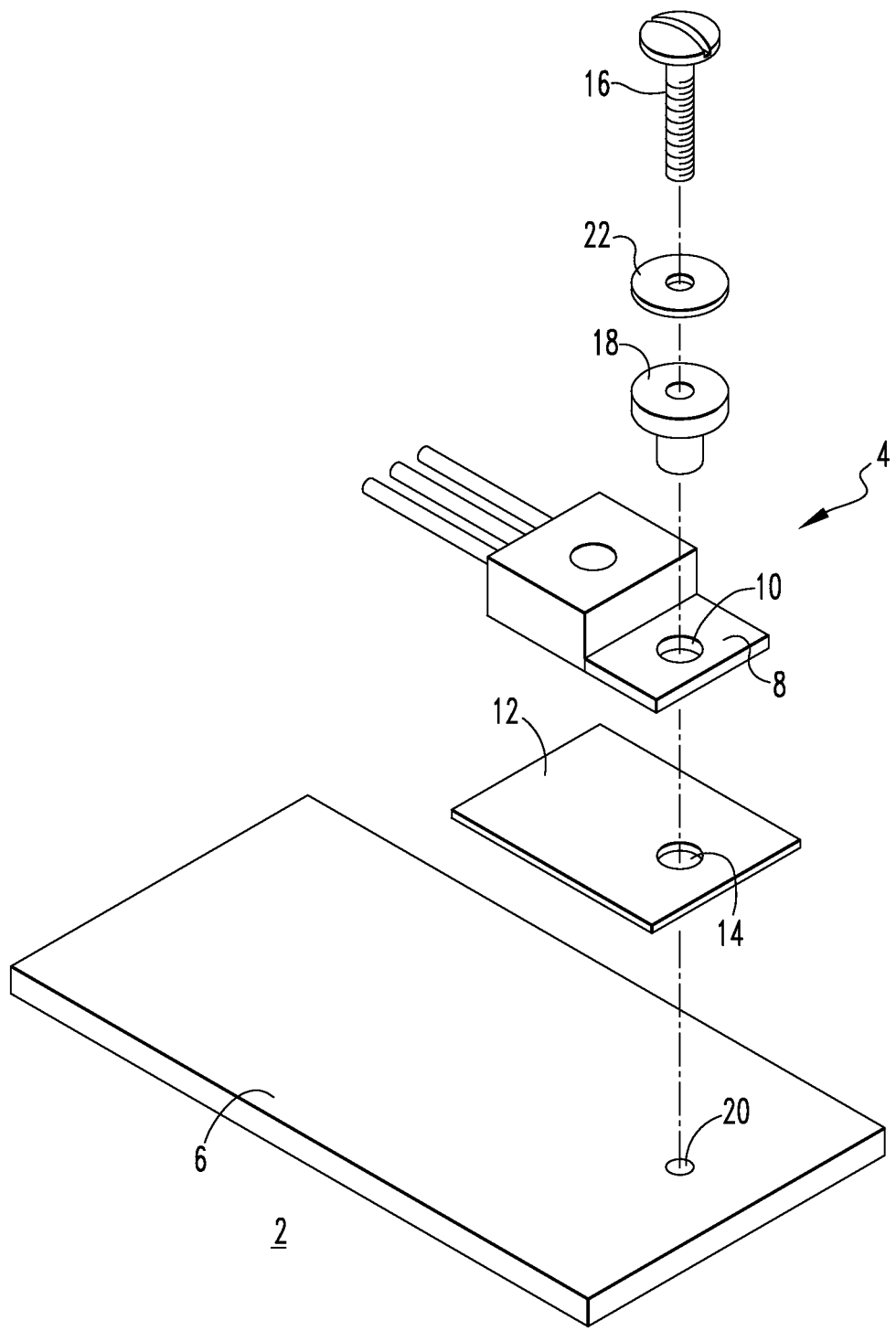
FIG. 1 is an exploded isometric view of a conventional FET mounting assembly.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, up, down, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the term "fastener" refers to any suitable connecting or tightening mechanism expressly including, but not limited to, rivets, screws, bolts and the combinations of bolts and nuts (e.g., without limitation, lock nuts) and bolts, washers and nuts.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "liquid crystalline polymer" shall mean a moldable (e.g., without limitation, by injection molding) material that is both thermally conductive and electrically non-conductive (e.g., an electrical insulator) exhibiting dielectric properties and expressly includes, but is not limited to, CoolPoly® D, which is available from Cool Polymers, Inc. having a place of business at 51 Circuit Drive, North Kingstown, R.I. 02852.

Figure 2:
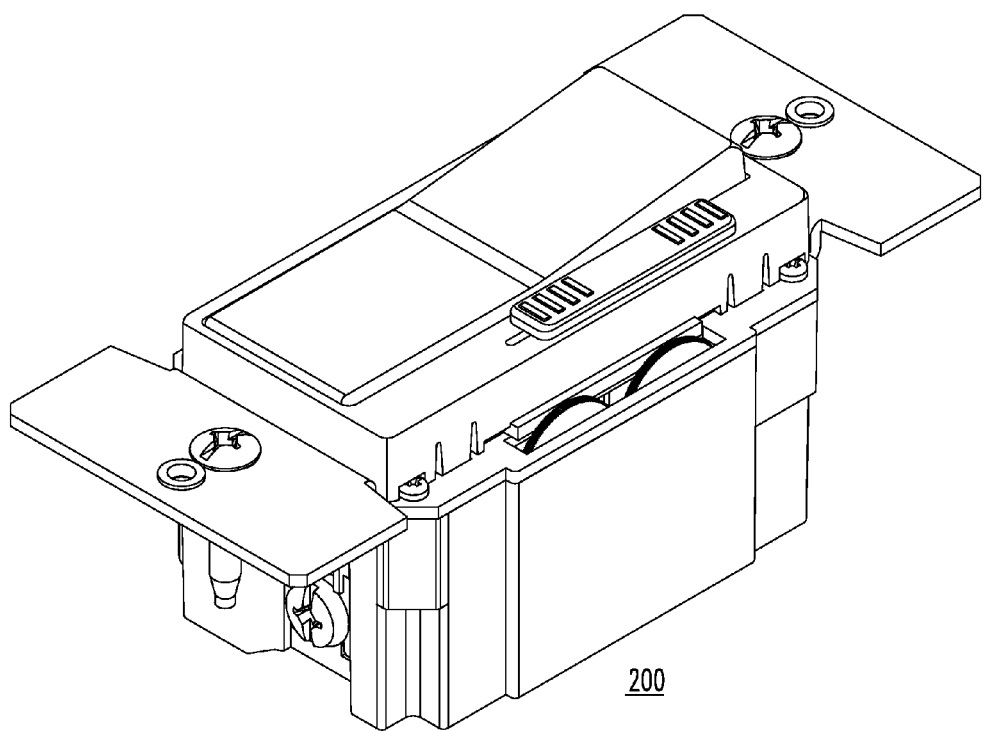
FIG. 2 is an isometric view of a dimmer switch in accordance with an embodiment of the disclosed concept.
Figure 3:
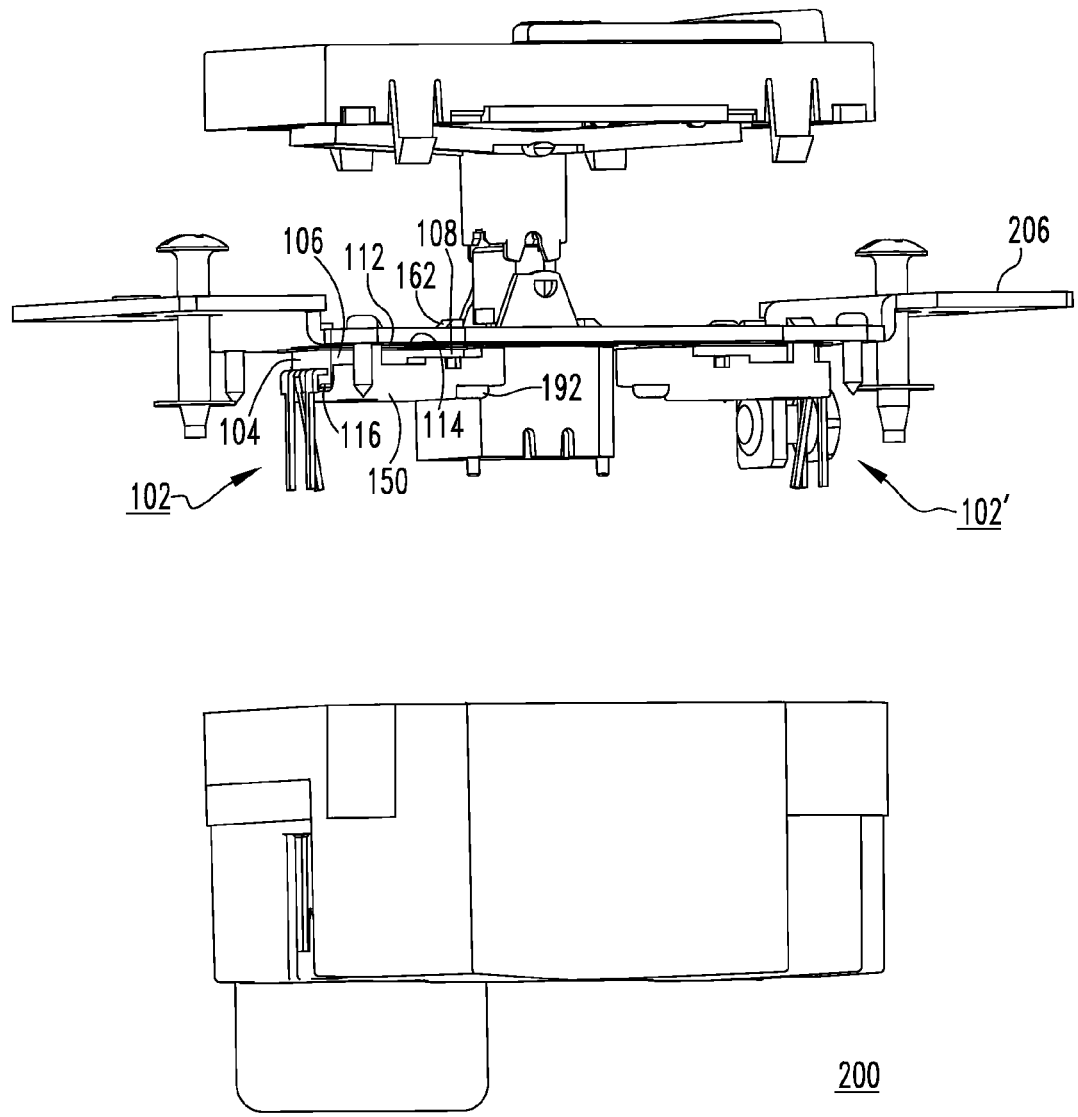
FIG. 3 is a partially exploded isometric view of the dimmer switch of FIG. 2, also showing a mounting assembly therefor, in accordance with an embodiment of the disclosed concept.

FIGS. 2 and 3 show one non-limiting example of an electrical switch 200 (e.g., without limitation, dimmer switch), which is structured to employ a mounting assembly 102 (FIG. 3) in accordance with the disclosed concept. As shown in FIG. 3 (see also FIG. 4), the electrical switch 200 includes a metal strap 206 (e.g., without limitation, heat sink) to which the mounting assembly 102 is suitably secured. In the example shown and described herein, the dimmer switch 200 includes two mounting assemblies 102, 102' (both shown in FIGS. 3 and 4). However, for ease of illustration and economy of disclosure, only one of the mounting assemblies 102 will be shown and described herein, in detail. It will be appreciated that mounting assembly 102' is preferably substantially similar to mounting assembly 102.

Figure 4:
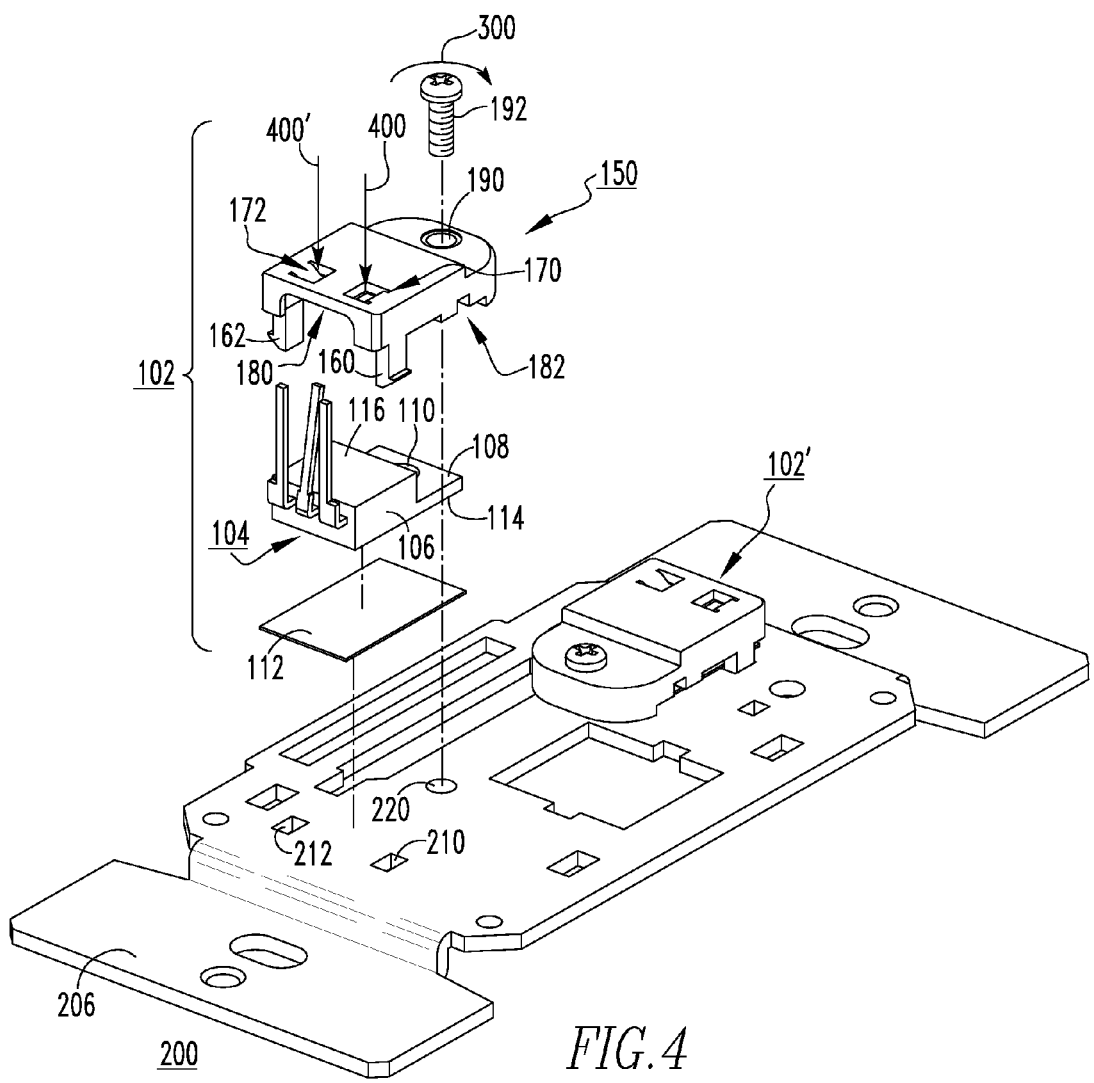
FIG. 4 is an exploded isometric view of the mounting assembly of FIG. 3.

Continuing to refer to FIG. 3, and also to FIG. 4, the example mounting assembly 102 includes a switching member 104 such as, for example and without limitation, the field effect transistor (FET), shown. An insulator 112 is structured to be disposed between the FET 104 and the heat sink 206. A separate cover member 150 overlays the FET 104 and is structured to secure the FET 104, and the insulator 112 (by way of compression force), to the heat sink 206.

The FET 104 includes a switch body 106, and a conductive tab 108 having a thru hole 110. The FET 104 has a first side 114 and an opposing second side 116. The conductive tab 108 extends laterally outwardly from the switch body 106, as best shown in FIG. 4. The insulator 112 is disposed between the first side 114 and the heat sink 206, and the separate cover member 150 cooperates with the second side 116. Specifically, the separate cover member 150 effectively secures the FET 104 to the heat sink 206, without requiring a separate fastener to be inserted through the aforementioned thru hole 110 of the conductive tab 108. Thus, the disclosed mounting assembly 102 advantageously eliminates disadvantages associated with prior art mounting assembly designs, such as mounting assembly 2 of FIG. 1. That is, unlike the insulator 12 of mounting assembly 2, which includes a thru hole 14, as shown in FIG. 1, the insulator 112 of the exemplary mounting assembly 102 is a planar member devoid of any such holes or apertures. Thus, the insulator 112 of the disclosed concept provided improved electrical isolation between the conductive tab 108 and the heat sink 206. This avoids dielectric breakdown at relatively high voltages caused from the unintentional arcing path that exists between the metal tab 8 of the FET 104 and the screw 16, by way of the thru hole 14 in the insulator 12, in the mounting assembly 2 of FIG. 1. The problem can be compounded if the gap between the metal tab 8 and screw 16 are not controlled properly, for example, due to manufacturing quality control issues such as part-two-part variation, or improper assembly methods. The disclosed mounting assembly 102 eliminates any chance of such dielectric breakdown, because it eliminates the necessity to provide a hole (e.g., thru hole 14 of FIG. 1) in the insulator (see, for example, insulator 112 of FIG. 4, which is devoid of any holes, openings or apertures).

Figure 5A:
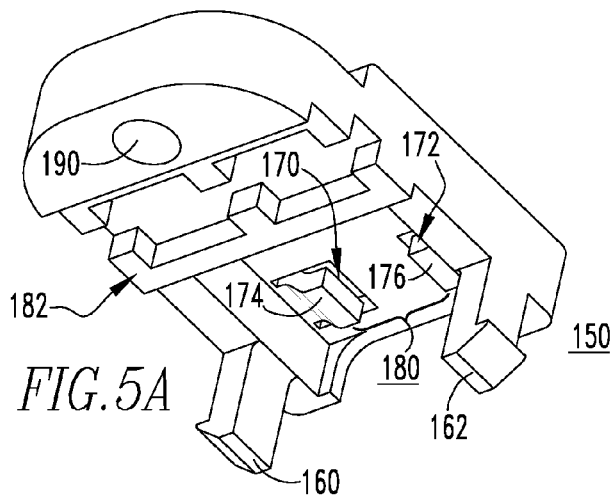
FIGS. 5A and 5B are bottom isometric and top isometric views, respectively, of a portion of the mounting assembly of FIG. 4.
Figure 5B:
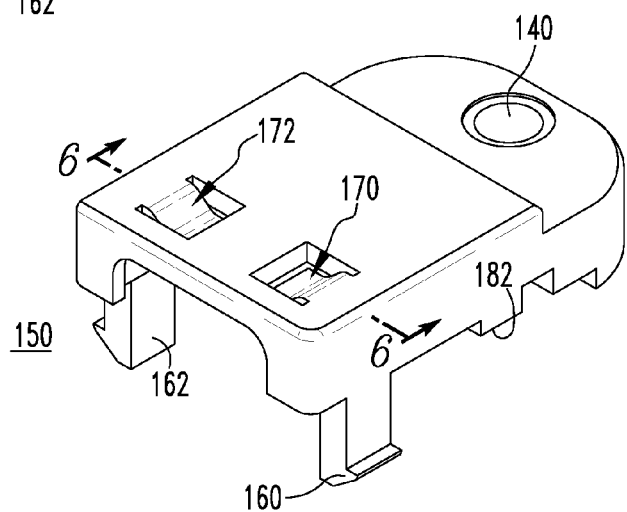

Additionally, as will be described in greater detail herein, the unique separate cover member 150 of the disclosed mounting assembly 102 serves to effectively mount the FET 104 to the heat sink 206, without using the hole 110 of the conductive tab 108 of the FET 104 as a means for mounting or clamping, as is required by the mounting assembly 2 of FIG. 1. Among other benefits, the disclosed mounting assembly 102 enables improved thermal dissipation between the FET 104 and heat sink 206 by providing better contact surface area through a number of unique resting pad or contact portions (see, for example, first and second contact portions 180,182, shown and described herein with respect to FIGS. 4, 5A and 6). Further, the cover member 150 includes enhanced material properties for effective thermal conductivity and electrical insulation and dielectric performance, as well as a number of unique molded features for improving contact pressure between the FET 104 and, in particular, between the conductive tab 108 of the FET 104, and the heat sink 206, in order to ensure enhanced heat transfer. For example and without limitation, in one embodiment the separate cover member 150 is preferably a single-piece molded member made from a liquid crystalline polymer, as defined herein.

As shown in FIGS. 4, 5A, 5B and 6, the example cover member 150 is a single-piece molded member including a number of protrusions 160,162 (two are shown) and a number of projections 170,172 (two are shown). The protrusions 160,162, are structured to removably couple the separate cover member 150 to the heat sink 206 (FIG. 4). The projections 170,172 are structured to bias the switch member 104 (e.g., downwardly in the direction of arrows 400,400' from the perspective of FIG. 4) against the insulator 112 and the heat sink 206 to effectuate improved contact pressure, improved contact surface area, and corresponding improved heat transfer and electrical isolation.

In the example of FIG. 4, heat sink 206 includes a first aperture 210 and a second aperture 212. A first resilient prong 160 is structured to removably engage the heat sink 206 at or about the first aperture 210, and a second resilient prong 162 is structured to remove the engaged heat sink 206 at or about the second aperture 212. In this manner, the separate cover member 150 serves to effectively fasten or mount the mounting assembly 2 to the heat sink 206. In the example shown, the single-piece molded cover member 150 further includes an opening 190 for receiving a fastener 192. The fastener 192 is structured to extend through the opening 190 to engage the heat sink 206 at or about a corresponding hole 220 to further fasten and secure the mounting assembly 102 to the heat sink 206. As previously discussed hereinabove, the fastener 192 does not extend through the conductive tab 102 of the FET 104 and, importantly, does not extend through the insulator 112. Accordingly, effective electrical isolation is maintained between the FET conductive tab 108 and the heat sink 206 by way of the insulator 112.

Figure 6:
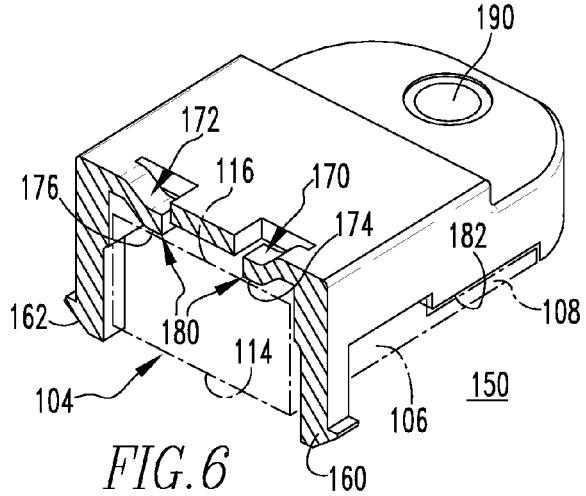
FIG. 6 is a section view taken along line 6-6 of FIG. 5B.

As best shown in the section view of FIG. 6, the example separate cover member 150 includes a first resilient projection 170 and a second resilient projection 172 disposed opposite and spaced from the first resilient projection 170. It will be appreciated, therefore, that the single-piece molded cover member 150 forms a first contact portion 180 and a second contact portion 182. That is, each of the first and second resilient projections 170,172 includes a corresponding contact surface 174,176, wherein the contact surfaces 174,176 together form the first contact portion 180. As shown in FIG. 6, the first contact portion 180 engages the second side 116 of the switch body 106 of the FET 104 (shown in phantom line drawing in simplified form in FIG. 6) to provide the aforementioned bias and enhanced contact or clamping pressure. The second contact portion 182 provides an enlarged contact surface area for engaging and suitably applying contact pressure to the conductive tab 108 of the FET 104. Accordingly, it will be appreciated that, in operation, the separate molded cover member 150 is disposed over the FET 104 such that the first and second resilient prongs 160,162 are removably disposed in first and second apertures 210,212, respectively, of the heat sink 206 and, as the cover member 150 is further secured to the heat sink 206, for example by applying torque to screw 192 (e.g., turning screw 192 clockwise in the direction of arrow 300 from the perspective of FIG. 4) to fasten the cover member 150 and mounting assembly 102 to the heat sink 206, the first and second resilient projections 170,172 engage the top surface 116 of the FET 104 providing a downward bias thereon in the direction of arrows 400,400' of FIG. 4.

Accordingly, the disclosed mounting assembly 102 provides improved contact surface area, contact pressure and, therefore, enhanced thermal dissipation between the FET 104 and the heat sink 206. Moreover, the improved arrangement of the insulator 112, which is devoid of any openings or apertures, provides improved electrical isolation between the FET 104 and, in particular, the conductive tab 108 thereof, and the heat sink 206. Accordingly, improved heat transfer is established while simultaneously avoiding dielectric breakdown issues known to exist with prior art mounting assembly designs (e.g., without limitation, mounting assembly 2 of FIG. 1).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A mounting assembly for an electrical switch, said electrical switch including a heat sink having a first surface, a second surface parallel to the first surface and facing away from the first surface, said mounting assembly comprising:
    a switching member;
    an insulator structured to be disposed between said switching member and said heat sink, said insulator engaging the first surface; and
    a separate cover member overlaying said switching member and being structured to secure said switching member and said insulator to said heat sink,
    wherein said separate cover member is a molded member comprising a first protrusion and a second protrusion each structured to extend through said heat sink and engage the second surface in order to removably couple said separate cover member to said heat sink,
    wherein said separate cover member is structured to be removably coupled to said heat sink without requiring a separate clamping member to be inserted through said switching member,
    wherein said switching member is disposed between said first protrusion and said second protrusion, and
    wherein said switching member extends from proximate said first protrusion to proximate said second protrusion.

2. The mounting assembly of claim 1 wherein said switching member comprises a switch body, a conductive tab, a first side, and a second side disposed opposite the first side; wherein said conductive tab extends laterally outwardly from said switch body; wherein said insulator is structured to be disposed between the first side and said heat sink; and wherein said separate cover member cooperates with the second side.

3. The mounting assembly of claim 2 wherein said conductive tab includes a thru hole; and wherein said separate cover member is structured to secure said switching member to said heat sink, without requiring a separate fastener to be inserted through said thru hole.

4. The mounting assembly of claim 2 wherein said insulator is a planar member devoid of any holes or apertures, thereby electrically isolating said conductive tab from said heat sink.

5. The mounting assembly of claim 4 wherein said molded member further comprises an opening and a fastener; and wherein said fastener is structured to extend through said opening and engage said heat sink to fasten said mounting assembly to said heat sink.

6. The mounting assembly of claim 2 wherein said molded member further comprises a number of projections structured to bias said switching member against said insulator and said heat sink.

7. The mounting assembly of claim 6 wherein said heat sink includes a first aperture and a second aperture; wherein said first protrusion is a first resilient prong; wherein said second protrusion is a second resilient prong; wherein said first resilient prong is structured to removably engage said heat sink at or about said first aperture; and wherein said second resilient prong is structured to removably engage said heat sink at or about said second aperture.

8. The mounting assembly of claim 6 wherein said number of projections is a first resilient projection and a second resilient projection disposed opposite and spaced from said first resilient projection.

9. The mounting assembly of claim 8 wherein said molded member further comprises a first contact portion and a second contact portion; wherein each of said first resilient projection and said second resilient projection includes a contact surface; wherein said contact surface of said first resilient projection and said contact surface of said second resilient projection together form said first contact portion; wherein said first contact portion engages the second side of said switch body; and wherein said second contact portion engages said conductive tab.

10. The mounting assembly of claim 1 wherein said separate cover member is a single piece molded member; and wherein said single piece molded member is made from a liquid crystalline polymer.

11. An electrical switch comprising:
a heat sink having a first surface, a second surface parallel to the first surface and facing away from the first surface; and
a mounting assembly comprising:
a switching member,
an insulator disposed between said switching member and said heat sink, said insulator engaging the first surface, and
a separate cover member overlaying said switching member and securing said switching member and said insulator to said heat sink,
wherein said separate cover member is a molded member comprising a first protrusion and a second protrusion each extending through said heat sink and engaging the second surface in order to removably couple said separate cover member to said heat sink,
wherein said separate cover member is removably coupled to said heat sink without requiring a separate clamping member,
wherein said switching member is disposed between said first protrusion and said second protrusion, and
wherein said switching member extends from proximate said first protrusion to proximate said second protrusion.

12. The electrical switch of claim 11 wherein said switching member comprises a switch body, a conductive tab, a first side, and a second side disposed opposite the first side; wherein said conductive tab extends laterally outwardly from said switch body; wherein said insulator is disposed between the first side and said heat sink; and wherein said separate cover member cooperates with the second side.

13. The electrical switch of claim 12 wherein said conductive tab includes a thru hole; wherein said separate cover member secures said switching member to said heat sink, without requiring a separate fastener to be inserted through said thru hole; and wherein said insulator is a planar member devoid of any holes or apertures, thereby electrically isolating said conductive tab from said heat sink.

14. The electrical switch of claim 12 wherein said molded member further comprises a number of projections biasing said switching member against said insulator and said heat sink.

15. The electrical switch of claim 14 wherein said heat sink includes a first aperture and a second aperture; wherein said first protrusion is a first resilient prong; wherein said second protrusion is a second resilient prong; wherein said first resilient prong removably engages said heat sink at or about said first aperture; and wherein said second resilient prong removably engages said heat sink at or about said second aperture.

16. The electrical switch of claim 14 wherein said number of projections is a first resilient projection and a second resilient projection disposed opposite and spaced from said first resilient projection.

17. The electrical switch of claim 16 wherein said molded member further comprises a first contact portion and a second contact portion; wherein each of said first resilient projection and said second resilient projection includes a contact surface; wherein said contact surface of said first resilient projection and said contact surface of said second resilient projection together form said first contact portion; wherein said first contact portion engages the second side of said switch body; and wherein said second contact portion engages said conductive tab.

18. The electrical switch of claim 14 wherein said molded member further comprises an opening and a fastener; and wherein said fastener extends through said opening and engage said heat sink to fasten said mounting assembly to said heat sink.

19. The electrical switch of claim 11 wherein said separate cover member is a single piece molded member; and wherein said single piece molded member is made from a liquid crystalline polymer.

20. The electrical switch of claim 11 wherein said electrical switch is a dimmer switch; and wherein said switching member is a FET.

* * * * *